United States Patent [19]

Barber

[11] Patent Number: 5,700,723
[45] Date of Patent: Dec. 23, 1997

[54] METHOD OF PACKAGING AN INTEGRATED CIRCUIT

[75] Inventor: Ivor G. Barber, San Jose, Calif.

[73] Assignee: LSI Logic Corporation, Milpitas, Calif.

[21] Appl. No.: 648,350

[22] Filed: May 15, 1996

[51] Int. Cl.⁶ .................................................. H01L 21/60
[52] U.S. Cl. .............. 437/214; 437/209; 437/211; 437/215
[58] Field of Search ................. 437/209, 211, 437/212, 214, 217, 218, 219, 220; 174/52.2; 361/820

[56] References Cited

U.S. PATENT DOCUMENTS

| | | | |
|---|---|---|---|
| 4,942,140 | 7/1990 | Ootsuki et al. | 437/211 |
| 5,101,324 | 3/1992 | Sato | 174/52.2 |
| 5,134,773 | 8/1992 | LeMaire et al. | 437/209 |
| 5,139,969 | 8/1992 | Mori | 437/217 |
| 5,179,039 | 1/1993 | Ishida et al. | 437/211 |
| 5,249,101 | 9/1993 | Frey et al. | 437/211 |
| 5,264,393 | 11/1993 | Tamura et al. | 437/209 |
| 5,450,283 | 9/1995 | Lin et al. | 174/52.2 |
| 5,461,197 | 10/1995 | Hiruta et al. | 174/52.2 |
| 5,482,896 | 1/1996 | Tang | 437/211 |
| 5,579,208 | 11/1996 | Howda et al. | 174/52.2 |

*Primary Examiner*—Kevin Picardat
*Attorney, Agent, or Firm*—Luedeka, Neely & Graham, P.C.

[57] ABSTRACT

A method of packaging an integrated circuit. The integrated circuit is connected to a substrate, and a mold is applied to the substrate. The mold and the substrate define a cavity and at least one covered chase, and the integrated circuit is disposed within the cavity. A compound is injected into the cavity through one of the covered chases, underfilling and encapsulating the integrated circuit. In one embodiment the mold is then removed from the substrate. In an alternate embodiment the mold is fixedly applied to the substrate.

14 Claims, 2 Drawing Sheets

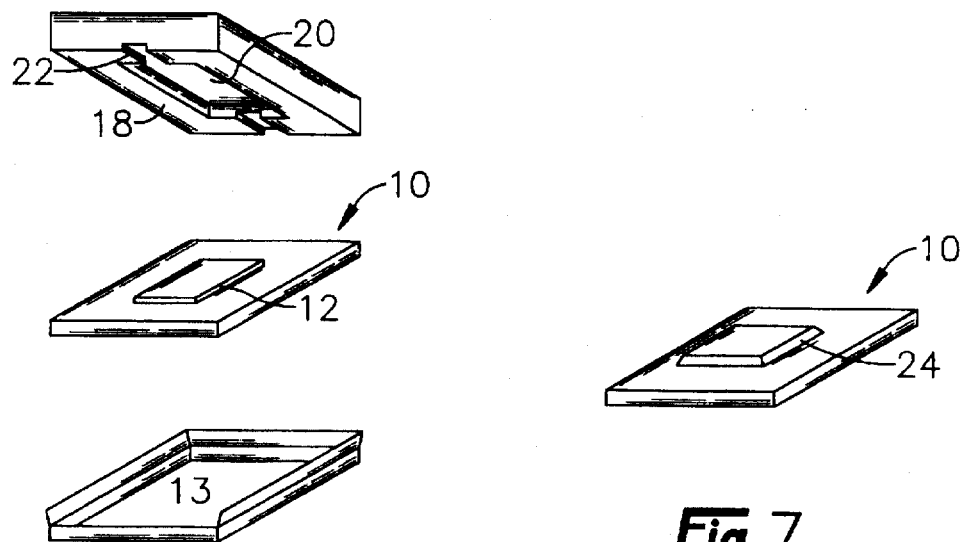
Fig. 6
Fig. 7
Fig. 8
Fig. 9
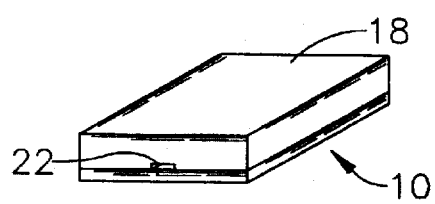
Fig. 10
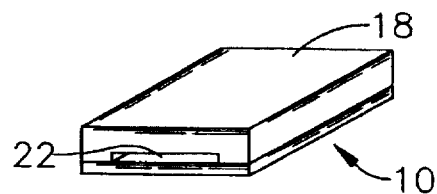
Fig. 11

METHOD OF PACKAGING AN INTEGRATED CIRCUIT

FIELD OF THE INVENTION

This invention relates to the field of integrated circuit packaging. More particularly the invention relates to the field of underfilling and encapsulating flip chips.

BACKGROUND OF THE INVENTION

Integrated circuits are typically packaged prior to use, to protect them from subsequent handling and the environment in which they will be used. As a part of the packaging process, some types of integrated circuits, such as flip chips, are typically underfilled prior to encapsulation.

The underfilling process is intended to fill the gap that would otherwise exist between the surface of the flip chip and the surface of the substrate to which the flip chip is electrically connected. The electrical connections are made by small solder bumps which are placed between the flip chip and the substrate. Thus, it is the solder bumps that create the gap between the flip chip and the substrate.

The gap is typically underfilled with a fluid material that is brought in contact with the edge of the gap. Capillary action wicks the fluid between the flip chip and the substrate, around the solder bumps, and filling the gap. However, various process parameters, such as contamination of one or both of the flip chip or substrate surfaces, impurity of the fluid material, or improper processing conditions can result in an incomplete underfill of the flip chip. This may leave small pockets or voids within the gap where there is no underfill material.

If the underfill material is designed to help conduct heat away from the flip chip, the voids may result in hot spots in the flip chip during use, and ultimately device failure. Therefore, it is typically regarded as essential to have as complete an underfill as possible.

Also, the underfill material is typically used to distribute the thermal expansion mismatch stress which exists between the flip chip and the substrate, instead of the stress concentrating in the solder bumps. Voids in the underfill material tend to cause local high stress regions, and may lead to bump failure during temperature cycling of the integrated circuit.

Another drawback of this customary, capillary action method of underfilling the flip chip is that it is by nature a very labor intensive process which is not readily given to automation. Thus, the process is prone to the yield loss inherent with manual processes, and also the relatively high cost that is typically associated with manual processes.

What is needed, therefore, is a method of packaging an integrated circuit that more readily lends itself to automation and reduces the occurrence of incomplete underfill.

SUMMARY OF THE INVENTION

The above and other objects are met by a method of packaging an integrated circuit. The integrated circuit is connected to a substrate, and a mold is applied to the substrate. The mold and the substrate define a cavity and at least one covered chase extending from the cavity to the exterior of the applied mold and substrate, with the integrated circuit disposed within the cavity. A compound is injected into the cavity through one of the covered chases. In one embodiment the mold is then removed from the substrate. In an alternate embodiment the mold is fixedly applied to the substrate.

In a packaged circuit fabricated according to one method of the invention, there is a substrate and an integrated circuit electrically connected to the substrate. A heat conductive mold is fixedly applied to the substrate, and the substrate and the mold define a cavity and at least one covered chase extending from the cavity to the exterior of the applied mold and substrate. The integrated circuit is disposed within and partially fills the cavity leaving voids therein, and heat conductive epoxy is disposed within and at least partially fills the voids within the cavity.

By using transfer molding techniques to underfill the flip chip, the underfill material may be applied under some degree of pressure. This tends to result in a much faster and more complete underfill, leaving fewer voids than the traditional capillary underfill process.

BRIEF DESCRIPTION OF THE DRAWINGS

Further advantages of the invention will become apparent by reference to the detailed description of preferred embodiments when considered in conjunction with the following drawings, in which like reference numerals denote like elements throughout the several views, and which are not to scale so as to more clearly show the finer details, and wherein:

FIG. 6 depicts how the mold is applied to an integrated circuit;

FIG. 7 depicts an encapsulated integrated circuit;

FIG. 8 depicts the mold of FIG. 2;

FIG. 9 depicts the mold of FIG. 3;

FIG. 10 depicts the mold of FIG. 2 on a substrate with compound injected; and

FIG. 11 depicts the mold of FIG. 3 on a substrate with compound injected.

DETAILED DESCRIPTION OF THE INVENTION

Figure 1:
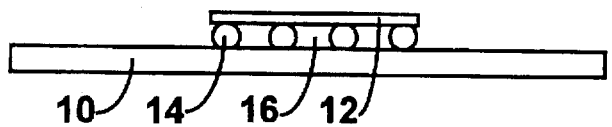
FIG. 1 is a cross-sectional view of an integrated circuit electrically connected to a substrate.

Referring now to the drawings, there is depicted in FIG. 1 a substrate 10, to which there is connected an integrated circuit 12. The integrated circuit 12 is connected to the substrate 10 by means of solder bumps 14. Because the solder bumps 14 preferably do not contact each other, there is left between the substrate 10 and the integrated circuit 12 a gap 16.

The integrated circuit 12 is preferably a flip chip device. The substrate is of a type commonly used in the art, and may be formed of, without limitation, plastic, flex circuit, or ceramic.

Figure 2:
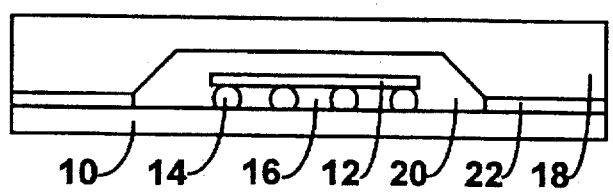
FIG. 2 is a cross-sectional view of a mold applied to a substrate.

A form 18 is applied to the substrate as depicted in FIG. 2. Another view of the form 18 of FIG. 2 is depicted in FIG. 8. In the embodiment depicted in FIG. 2, the form 18 has the same length and width as the substrate 10, however, in other embodiments, the form 18 is not necessarily the same size as the substrate 10. If the form 18 is to be left in place as a part of the final package, as discussed in more detail below, then it may be formed of a heat conducting material such as copper or ceramic. If the form 18 is not to be left in place as a part of the final package, then the form 18 may be formed of any durable material, such as a metal.

FIG. 6 depicts the relative positions of the form 18 and the substrate 10 as they are brought toward one another. The substrate 10 may alternately be placed in a casing 13, to hold it as the mold 18 is applied.

The form 18 and the substrate 10 form a cavity 20 and at least one covered chase 22. The integrated circuit 12 is disposed within the cavity 20. In the embodiment depicted in FIG. 2 the covered chase 22 is smaller in cross-sectional area than is the cavity 20. However, in alternate embodiments the covered chase 22 may be the same size as, or even larger than the cavity 20.

If the form 18 is to be left in place as a part of the final package, then the form 18 is fixedly applied to the substrate 10, such as by using an adhesive at the interface between the form 18 and the substrate 10, or otherwise as explained in more detail below. If the form 18 is not to be left in place as a part of the final package, then the form 18 is removably applied to the substrate 10, such as by clamping.

Figure 3:
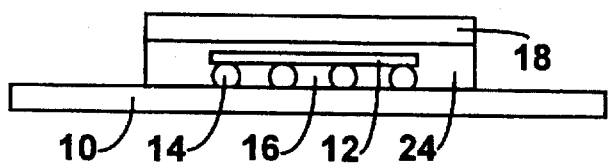
FIG. 3 is a cross-sectional view of a compound injected into the cavity between a mold and a substrate.

After the form 18 has been applied to the substrate 18, a compound 24 is injected through at least one of the covered chases 22 into the cavity 20, as depicted in FIG. 3. In the embodiment depicted in FIG. 3, the covered chase 22 has the same cross-sectional area as the cavity 20. Also in the embodiment depicted, the form 18 is neither as long nor as wide as the substrate 10. FIG. 9 depicts a mold 18 having covered chases 22 that have the same cross-sectional area as the cavity 20.

As can be seen, because the compound 24 is injected into the cavity 20, it tends to completely fill the gap 16 between the substrate 10 and the integrated circuit 12. The compound 24 is preferably a heat conductive material, such as an epoxy. In one embodiment, the mold 18 may be fixedly applied to the substrate 10 by means of the compound 24, rather than by a separate means.

Figure 4:
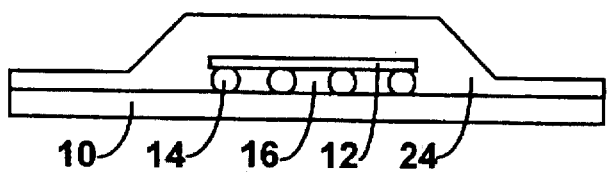
FIG. 4 is a cross-sectional view of an encapsulated integrated circuit without the mold.
Figure 5:
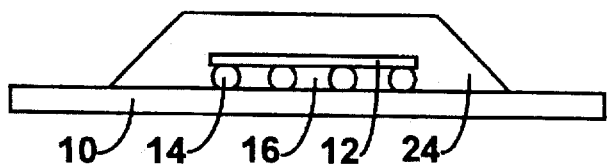
FIG. 5 is a cross-sectional view of an encapsulated integrated circuit where portions of the compound have been trimmed away.

In one embodiment the mold 18 is left in place on the substrate 10, as described above, and as depicted in FIGS. 3, 10, and 11. In alternate embodiments the mold 18 is removed from the substrate 10, as depicted in FIGS. 4 and 7. When this is done, the compound 24, which is both encapsulating and underfilling the integrated circuit 12, is left exposed, and forms part of the outside of the final package. As depicted in FIGS. 5 and 7, the portion of the compound 24 that was encased by the covered chase 22 can optionally be trimmed away, leaving behind just that portion of the compound 24 that was encased by the cavity 20.

While specific embodiments of the invention have been described with particularity above, it will be appreciated that the invention is equally applicable to other processes and is capable of numerous modifications and substitutions of parts and steps without departing from the scope of the invention.

What is claimed is:

1. A method of packaging an integrated circuit comprising:

connecting the integrated circuit to a substrate, applying a mold to the substrate, the mold and substrate defining a cavity and at least one covered chase extending from the cavity to the exterior of the applied mold and substrate, the integrated circuit disposed within the cavity, and injecting a compound into the cavity through one of the covered chases.

2. The method of claim 1 further comprising underfilling the integrated circuit with the compound injected into the cavity.

3. The method of claim 1 further comprising encapsulating the integrated circuit with the compound injected into the cavity.

4. The method of claim 1 wherein the step of connecting the integrated circuit to a substrate further comprises electrically connecting the integrated circuit to a substrate.

5. The method of claim 1 wherein the step of applying a mold to the substrate further comprises fixedly applying a mold to the substrate using an adhesive.

6. The method of claim 1 wherein the step of applying a mold to the substrate further comprises fixedly applying a heat conductive mold to the substrate using an adhesive.

7. The method of claim 1 wherein the step of injecting a compound into the cavity further comprises injecting a heat conductive epoxy into the cavity.

8. The method of claim 1 further comprising removing the mold from the substrate.

9. A packaged integrated circuit made by the method of claim 1.

10. A method of packaging an integrated circuit comprising:

electrically connecting the integrated circuit to a substrate, fixedly applying a heat conductive mold to the substrate using an adhesive, the mold and substrate defining a cavity and at least one covered chase extending from the cavity to the exterior of the applied mold and substrate, the integrated circuit disposed within the cavity, and injecting a heat conductive epoxy into the cavity through one of the covered chases.

11. The method of claim 10 further comprising underfilling the integrated circuit with the compound injected into the cavity.

12. The method of claim 10 further comprising encapsulating the integrated circuit with the compound injected into the cavity.

13. A packaged integrated circuit made by the method of claim 10.

14. A method of packaging an integrated circuit comprising:

electrically connecting the integrated circuit to a substrate, removably applying a mold to the substrate, the mold and substrate defining a cavity and at least one covered chase, the integrated circuit disposed within the cavity, injecting a heat conductive epoxy into the cavity through one of the covered chases, and removing the mold from the substrate.

* * * * *